(12) United States Patent
Fayrushin et al.

(10) Patent No.: US 11,616,079 B2
(45) Date of Patent: *Mar. 28, 2023

(54) SEMICONDUCTOR PILLARS HAVING TRIANGULAR-SHAPED LATERAL PERIPHERIES, AND INTEGRATED ASSEMBLIES

(71) Applicant: Micron Technology, Inc., Boise, ID (US)

(72) Inventors: Albert Fayrushin, Boise, ID (US); Augusto Benvenuti, Lallio (IT); Haitao Liu, Boise, ID (US); Xin Lan, Singapore (SG)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/525,817

(22) Filed: Nov. 12, 2021

(65) Prior Publication Data

US 2022/0068969 A1 Mar. 3, 2022

Related U.S. Application Data

(63) Continuation of application No. 16/704,938, filed on Dec. 5, 2019, now Pat. No. 11,201,167.

(51) Int. Cl.
| | |
|---|---|
| *H01L 27/11582* | (2017.01) |
| *H01L 29/10* | (2006.01) |
| *H01L 27/11573* | (2017.01) |
| *H01L 29/51* | (2006.01) |
| *H01L 27/11565* | (2017.01) |

(52) U.S. Cl.
CPC .. *H01L 27/11582* (2013.01); *H01L 27/11565* (2013.01); *H01L 27/11573* (2013.01); *H01L 29/1037* (2013.01); *H01L 29/513* (2013.01); *H01L 29/518* (2013.01)

(58) Field of Classification Search
CPC ......... H01L 27/11582; H01L 27/11573; H01L 27/11565; H01L 29/1037; H01L 29/518; H01L 29/513
See application file for complete search history.

(56) References Cited

U.S. PATENT DOCUMENTS

| | | | |
|---|---|---|---|
| 11,201,167 B2* | 12/2021 | Fayrushin | ........... H01L 29/1037 |
| 2006/0249776 A1 | 11/2006 | Manning | |
| 2017/0040339 A1* | 2/2017 | Lee | ................... H01L 27/11582 |
| 2017/0062603 A1* | 3/2017 | Suzuki | .............. H01L 29/78696 |

(Continued)

*Primary Examiner* — Sitaramarao S Yechuri
(74) *Attorney, Agent, or Firm* — Wells St. John P.S.

(57) ABSTRACT

Some embodiments include a pillar which contains semiconductor material, and which extends primarily along a first direction. A cross-section through the pillar along a second direction orthogonal to the first direction is through the semiconductor material and includes a lateral periphery of the pillar configured as three-sided shape. Some embodiments include an integrated assembly having a vertical stack of alternating first and second levels. The first levels include conductive structures and the second levels are insulative. Channel-material-pillars extend through the vertical stack. Each of the channel-material-pillars has a top-down cross-section which includes a lateral periphery configured as three-sided shape of an equilateral triangle with rounded vertices.

25 Claims, 9 Drawing Sheets

(56) References Cited

U.S. PATENT DOCUMENTS

| | | |
|---|---|---|
| 2017/0133327 A1 | 5/2017 | Schmitt |
| 2017/0256560 A1* | 9/2017 | Tsuda ................ H01L 27/11565 |
| 2019/0043874 A1 | 2/2019 | Thimmegowda |
| 2019/0363115 A1 | 11/2019 | Chuang |
| 2020/0091187 A1* | 3/2020 | Lee ................... H01L 27/11575 |
| 2020/0168625 A1 | 5/2020 | Liu |
| 2020/0258902 A1 | 8/2020 | Xiao |

* cited by examiner

SEMICONDUCTOR PILLARS HAVING TRIANGULAR-SHAPED LATERAL PERIPHERIES, AND INTEGRATED ASSEMBLIES

RELATED PATENT DATA

This patent resulted from continuation application of U.S. patent application Ser. No. 16/704,938, filed Dec. 5, 2019, the disclosures of which are incorporated herein by reference.

TECHNICAL FIELD

Integrated assemblies (e.g., memory devices). Semiconductor pillars (e.g., pillars comprising channel material of vertically-stacked memory devices). Pillars having triangular-shaped outer peripheries.

BACKGROUND

Memory provides data storage for electronic systems. Flash memory is one type of memory, and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of flash memory, and may be configured to comprise vertically-stacked memory cells.

Figure 1:
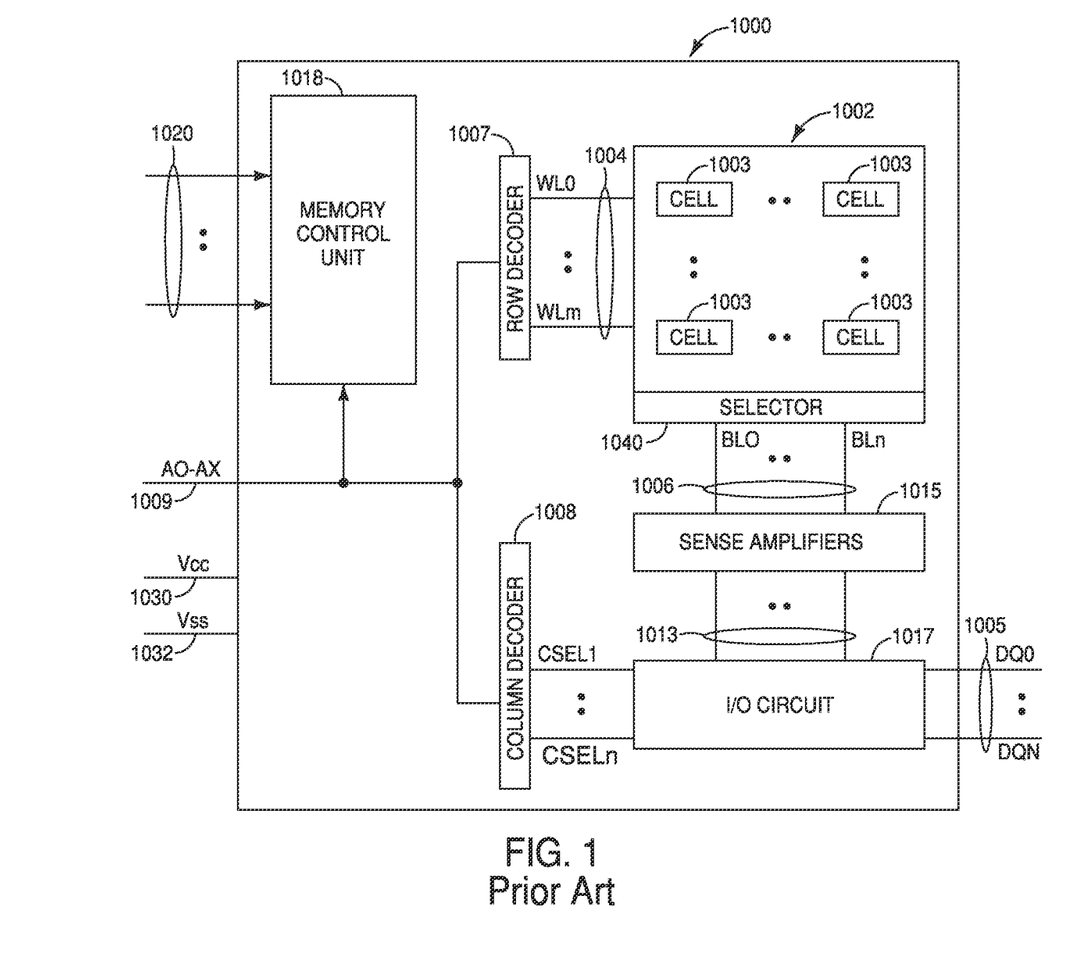
FIG. 1 shows a block diagram of a prior art memory device having a memory array with memory cells.

Before describing NAND specifically, it may be helpful to more generally describe the relationship of a memory array within an integrated arrangement. FIG. 1 shows a block diagram of a prior at device 1000 which includes a memory array 1002 having a plurality of memory cells 1003 arranged in rows and columns along with access lines 1004 (e.g., wordlines to conduct signals WL0 through WLm) and first data lines 1006 (e.g., bitlines to conduct signals BL0 through BLn). Access lines 1004 and first data lines 1006 may be used to transfer information to and from the memory cells 1003. A row decoder 1007 and a column decoder 1008 decode address signals A0 through AX on address lines 1009 to determine which ones of the memory cells 1003 are to be accessed. A sense amplifier circuit 1015 operates to determine the values of information read from the memory cells 1003. An I/O circuit 1017 transfers values of information between the memory array 1002 and input/output (I/O) lines 1005. Signals DQ0 through DQN on the I/O lines 1005 can represent values of information read from or to be written into the memory cells 1003. Other devices can communicate with the device 1000 through the I/O lines 1005, the address lines 1009, or the control lines 1020. A memory control unit 1018 is used to control memory operations which are to be performed on the memory cells 1003, and utilizes signals on the control lines 1020. The device 1000 can receive supply voltage signals Vcc and Vss on a first supply line 1030 and a second supply line 1032, respectively. The device 1000 includes a select circuit 1040 and an input/output (I/O) circuit 1017. The select circuit 1040 can respond, via the I/O circuit 1017, to signals CSEL1 through CSELn to select signals on the first data lines 1006 and the second data lines 1013 that can represent the values of information to be read from or to be programmed into the memory cells 1003. The column decoder 1008 can selectively activate the CSEL1 through CSELn signals based on the A0 through AX address signals on the address lines 1009. The select circuit 1040 can select the signals on the first data lines 1006 and the second data lines 1013 to provide communication between the memory array 1002 and the I/O circuit 1017 during read and programming operations.

Figure 2:
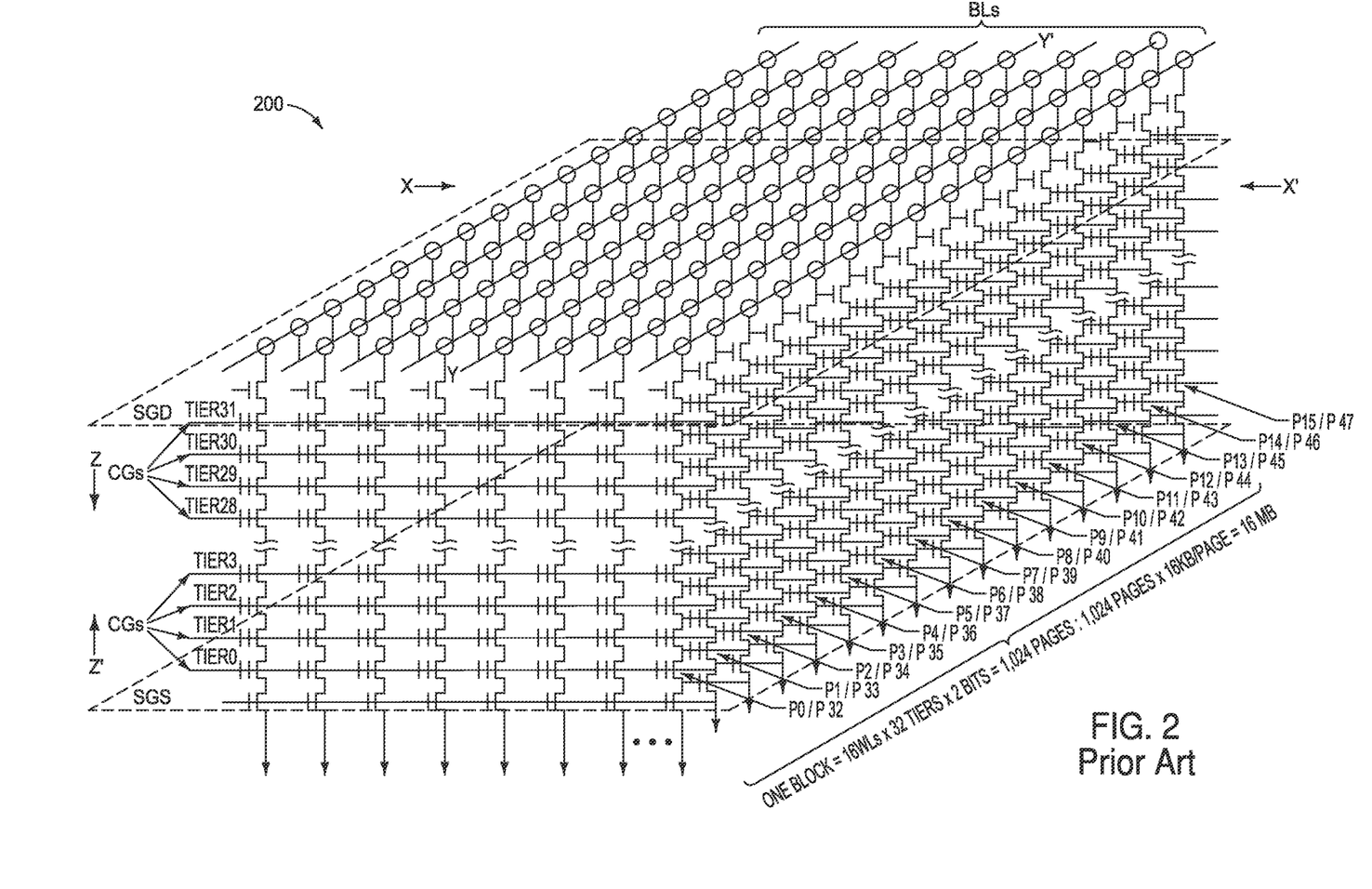
FIG. 2 shows a schematic diagram of the prior art memory device of FIG. 1 in the form of a 3D NAND memory device.

The memory array 1002 of FIG. 1 may be a NAND memory array, and FIG. 2 shows a schematic diagram of a three-dimensional NAND memory device 200 which may be utilized for the memory array 1002 of FIG. 1. The device 200 comprises a plurality of strings of charge-storage devices. In a first direction (Z-Z'), each string of charge-storage devices may comprise, for example, thirty-two charge-storage devices stacked over one another with each charge-storage device corresponding to one of, for example, thirty-two tiers (e.g., Tier0-Tier31). The charge-storage devices of a respective string may share a common channel region, such as one formed in a respective pillar of semiconductor material (e.g., polysilicon) about which the string of charge-storage devices is formed. In a second direction (X-X'), each first group of, for example, sixteen first groups of the plurality of strings may comprise, for example, eight strings sharing a plurality (e.g., thirty-two) of access lines (i.e., "global control gate (CG) lines", also known as wordlines, WLs). Each of the access lines may couple the charge-storage devices within a tier. The charge-storage devices coupled by the same access line (and thus corresponding to the same tier) may be logically grouped into, for example, two pages, such as P0/P32, P1/P33, P2/P34 and so on, when each charge-storage device comprises a cell capable of storing two bits of information. In a third direction (Y-Y'), each second group of, for example, eight second groups of the plurality of strings, may comprise sixteen strings coupled by a corresponding one of eight data lines. The size of a memory block may comprise 1,024 pages and total about 16 MB (e.g., 16 WLs×32 tiers×2 bits=1,024 pages/block, block size=1.024 pages×16 KB/page=16 MB). The number of the strings, tiers, access lines, data lines, first groups, second groups and/or pages may be greater or smaller than those shown in FIG. 2.

Figure 3:
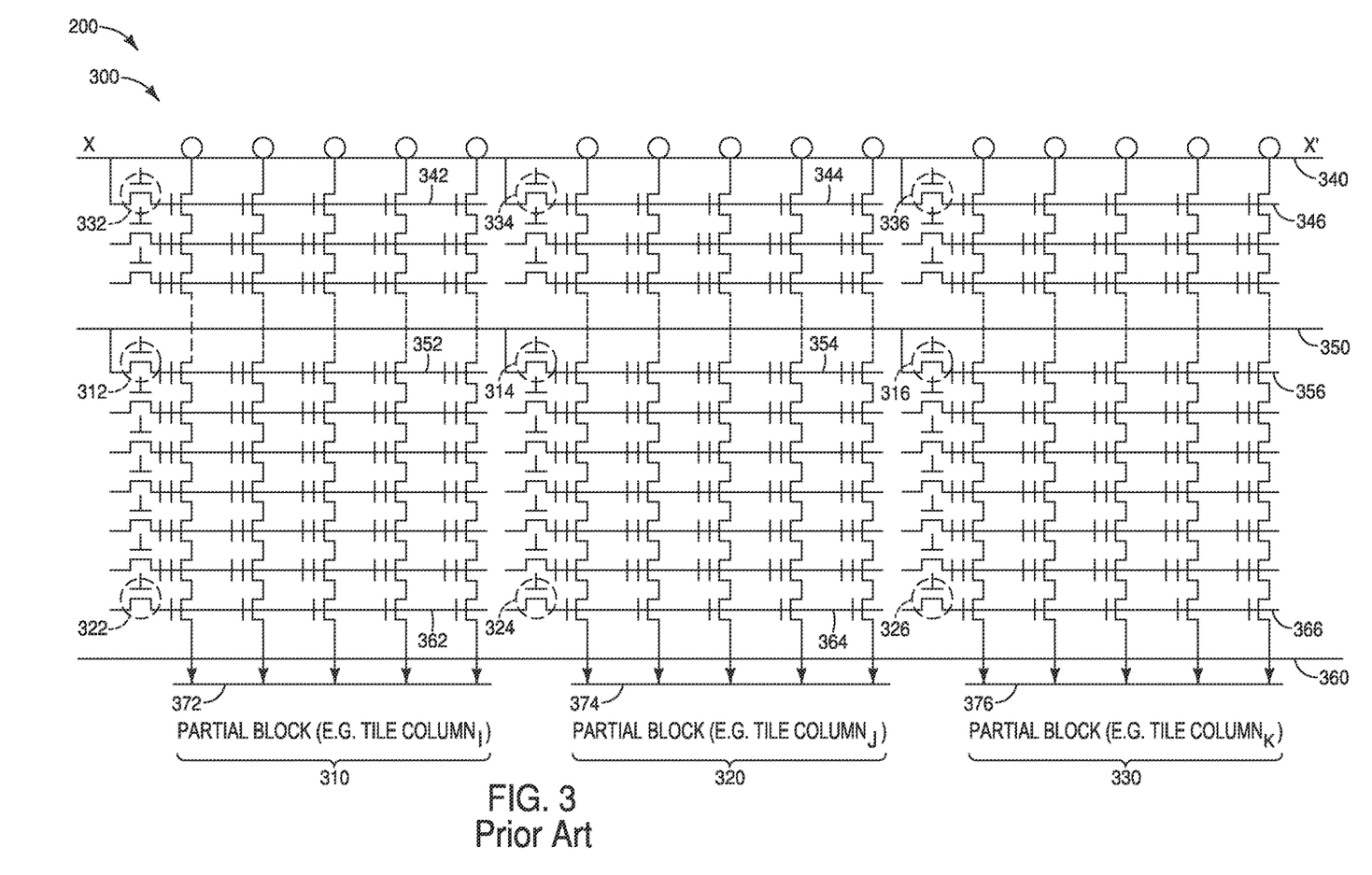
FIG. 3 shows a cross-sectional view of the prior art 3D NAND memory device of FIG. 2 in an X-X' direction.

FIG. 3 shows a cross-sectional view of a memory block 300 of the 3D NAND memory device 200 of FIG. 2 in an X-X' direction, including fifteen strings of charge-storage devices in one of the sixteen first groups of strings described with respect to FIG. 2. The plurality of strings of the memory block 300 may be grouped into a plurality of subsets 310, 320, 330 (e.g., tile columns), such as tile column$_1$, tile column$_j$ and tile column$_K$, with each subset (e.g., tile column) comprising a "partial block" of the memory block 300. A global drain-side select gate (SGD) line 340 may be coupled to the SGDs of the plurality of strings. For example, the global SGD line 340 may be coupled to a plurality (e.g., three) of sub-SGD lines 342, 344, 346 with each sub-SGD line corresponding to a respective subset (e.g., tile column), via a corresponding one of a plurality (e.g., three) of sub-SGD drivers 332, 334, 336. Each of the sub-SGD drivers 332, 334, 336 may concurrently couple or cut off the SGDs of the strings of a corresponding partial block (e.g., tile column) independently of those of other partial blocks. A global source-side select gate (SGS) line 360 may be coupled to the SGSs of the plurality of strings. For example, the global SGS line 360 may be coupled to a plurality of sub-SGS lines 362, 364, 366 with each sub-SGS line corresponding to the respective subset (e.g., tile column), via a corresponding one of a plurality of sub-SGS drivers 322, 324, 326. Each of the sub-SGS drivers 322, 324, 326 may concurrently couple or cut off the SGSs of the strings of a corresponding partial block (e.g., tile column) independently of those of other partial blocks. A global access line (e.g., a global CG line) 350 may couple the charge-storage devices corresponding to the respective tier of each of the plurality of strings. Each global CG line (e.g., the global CG line 350) may be coupled to a plurality of sub-access lines (e.g., sub-CG lines) 352, 354, 356 via a corresponding one of a plurality of sub-string drivers 312, 314 and 316. Each of the sub-string drivers may concurrently couple or cut off the charge-storage devices corresponding to the respective partial block and/or tier independently of those of other partial blocks and/or other tiers. The charge-storage devices corresponding to the respective subset (e.g., partial block) and the respective tier may comprise a "partial tier" (e.g., a single "tile") of charge-storage devices. The strings corresponding to the respective subset (e.g., partial block) may be coupled to a corresponding one of sub-sources 372, 374 and 376 (e.g., "tile source") with each sub-source being coupled to a respective power source.

Figure 4:
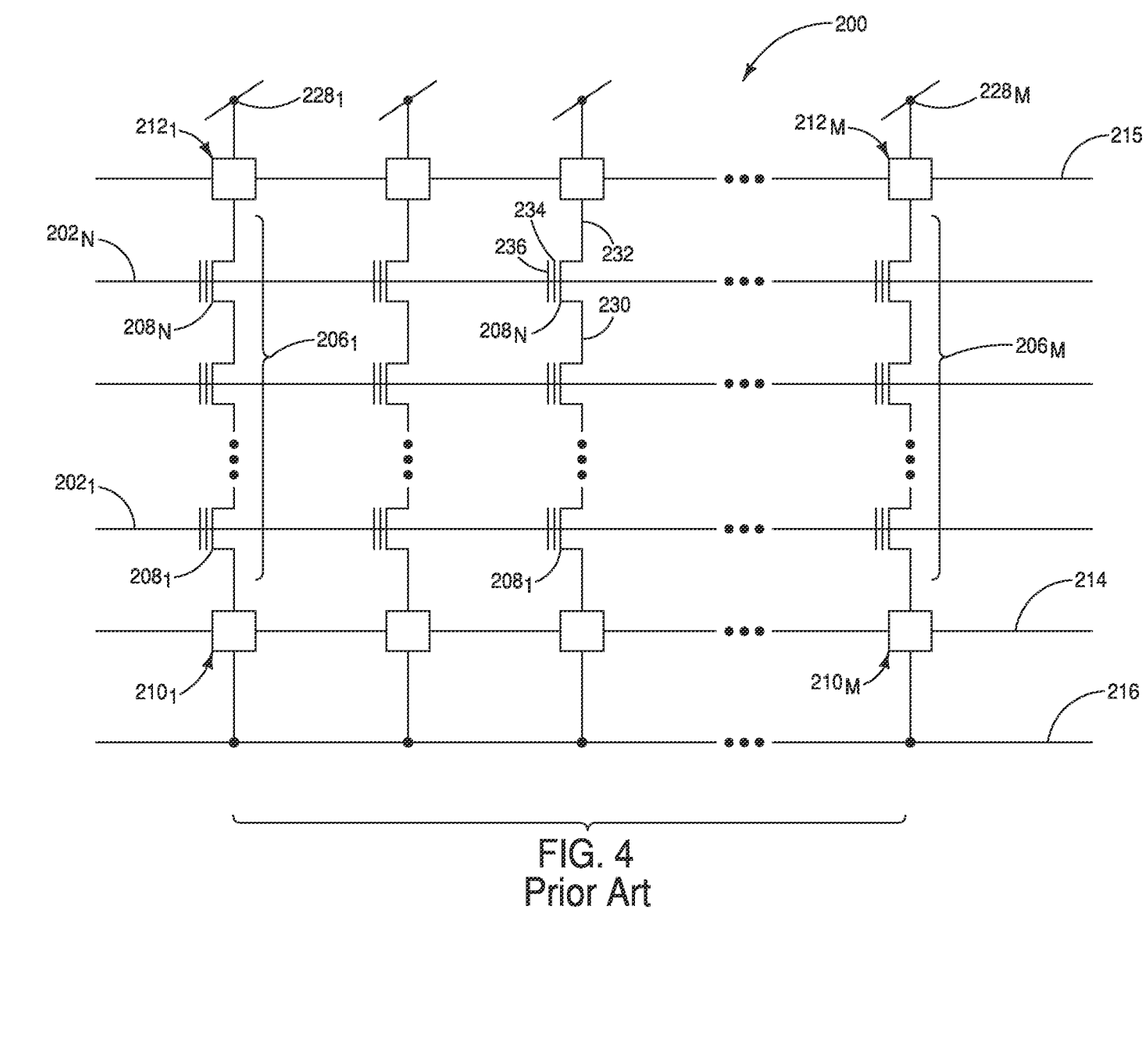
FIG. 4 is a schematic diagram of a prior art NAND memory array.

The NAND memory device 200 is alternatively described with reference to a schematic illustration of FIG. 4.

The memory array 200 includes wordlines $202_1$ to $202_N$, and bitlines $228_1$ to $228_M$.

The memory array 200 also includes NAND strings $206_1$ to $206_M$. Each NAND string includes charge-storage transistors $208_1$ to $208_N$. The charge-storage transistors may use floating gate material (e.g., polysilicon) to store charge, or may use charge-trapping material (such as, for example, silicon nitride, metallic nanodots, etc.) to store charge.

The charge-storage transistors 208 are located at intersections of wordlines 202 and strings 206. The charge-storage transistors 208 represent non-volatile memory cells for storage of data. The charge-storage transistors 208 of each NAND string 206 are connected in series source-to-drain between a source-select device (e.g., source-side select gate. SGS) 210 and a drain-select device (e.g., drain-side select gate, SGD) 212. Each source-select device 210 is located at an intersection of a string 206 and a source-select line 214, while each drain-select device 212 is located at an intersection of a string 206 and a drain-select line 215. The select devices 210 and 212 may be any suitable access devices, and are generically illustrated with boxes in FIG. 1.

A source of each source-select device 210 is connected to a common source line 216. The drain of each source-select device 210 is connected to the source of the first charge-storage transistor 208 of the corresponding NAND string 206. For example, the drain of source-select device $210_1$ is connected to the source of charge-storage transistor $208_1$ of the corresponding NAND string $206_1$. The source-select devices 210 are connected to source-select line 214.

The drain of each drain-select device 212 is connected to a bitline (i.e., digit line) 228 at a drain contact. For example, the drain of drain-select device $212_1$ is connected to the bitline $228_1$. The source of each drain-select device 212 is connected to the drain of the last charge-storage transistor 208 of the corresponding NAND string 206. For example, the source of drain-select device $212_1$ is connected to the drain of charge-storage transistor $208_N$ of the corresponding NAND string $206_1$.

The charge-storage transistors 208 include a source 230, a drain 232, a charge-storage region 234, and a control gate 236. The charge-storage transistors 208 have their control gates 236 coupled to a wordline 202. A column of the charge-storage transistors 208 are those transistors within a NAND string 206 coupled to a given bitline 228. A row of the charge-storage transistors 208 are those transistors commonly coupled to a given wordline 202.

It is desired to pack memory devices into increasingly tighter arrangements while maintaining rapid program/erase speeds and strong retention of charge.

DETAILED DESCRIPTION OF THE ILLUSTRATED EMBODIMENTS

Some embodiments include semiconductor-containing pillars (e.g., channel-material-pillars of NAND memory strings) having three-sided lateral peripheries. Some embodiments include integrated arrangements (e.g., memory arrays) comprising such semiconductor-containing pillars. Example embodiments are described with reference to FIGS. 5-16.

Figure 5:
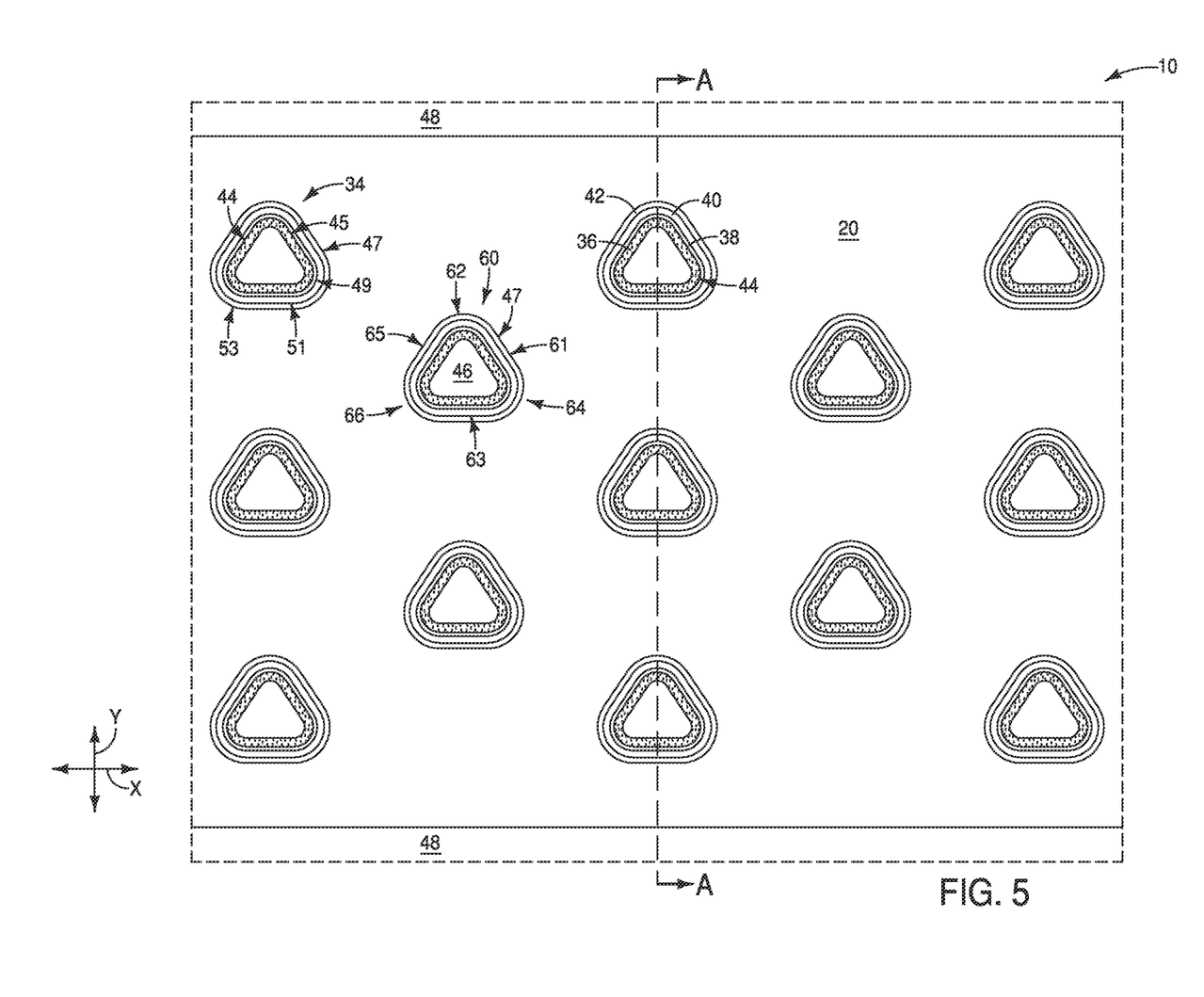
FIGS. 5 and 5A are a diagrammatic cross-sectional top-down view and a diagrammatic cross-sectional side view, respectively, of a region of an example integrated assembly (memory device). The cross-section of FIG. 5A is along the line A-A of FIG. 5, and the cross-section of FIG. 5 is along the line 5-5 of FIG. 5A.
Figure 5A:
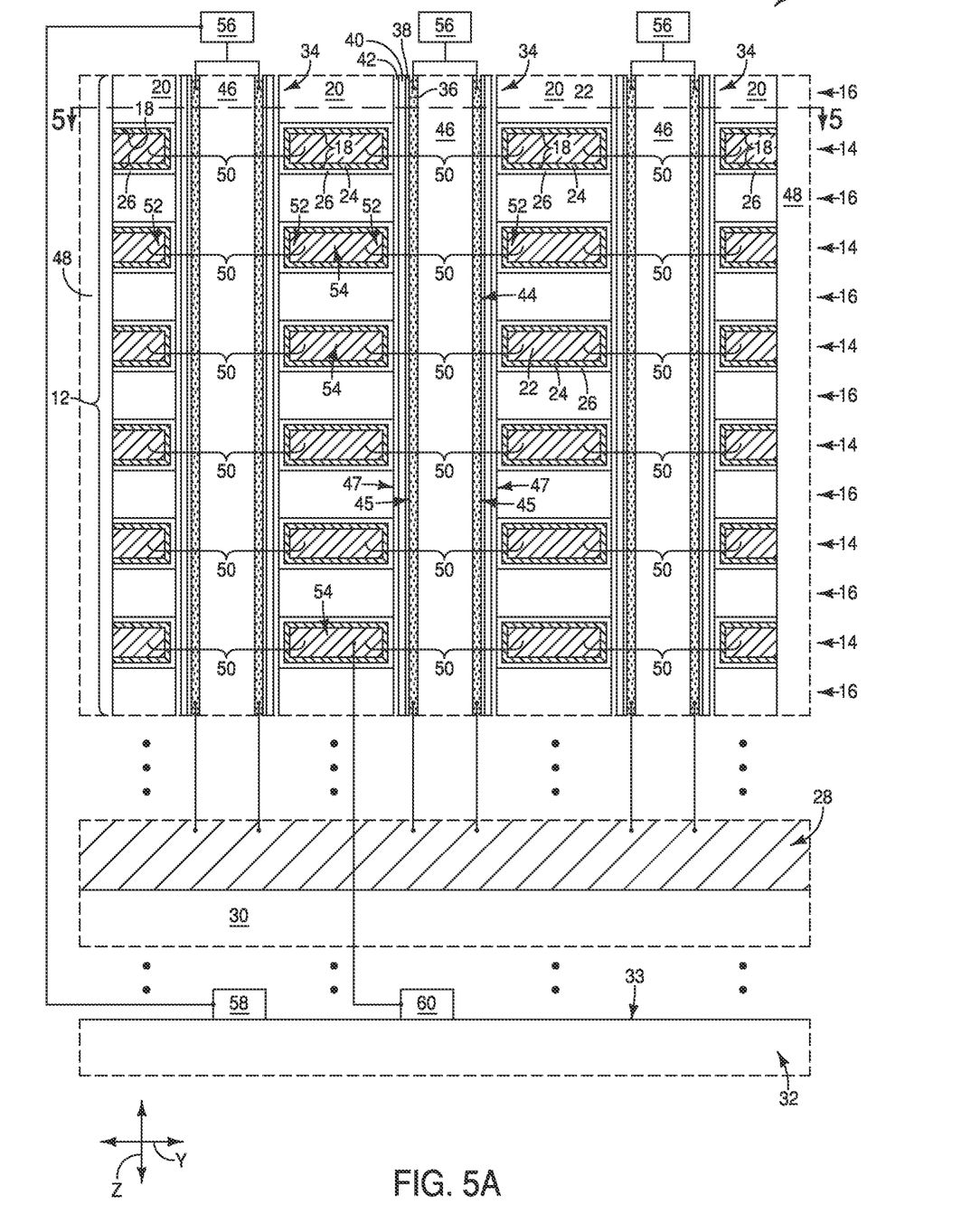

Referring to FIGS. 5 and 5A, an integrated assembly 10 includes a vertical stack 12 of alternating first and second levels 14 and 16. The first levels 14 comprise conductive structures 18 and may be referred to as conductive levels. The second levels 16 comprise insulative material 20 and may be referred to as insulative levels.

The conductive structures may comprise any suitable conductive composition(s). In the illustrated embodiment, each of the conductive structures 18 comprises a core material 22 and a conductive liner-material 24 extending along an outer periphery of the core material. In some embodiments, the core material 22 may comprise, consist essentially of, or consist of tungsten; and the liner-material 24 may comprise, consist essentially of, or consist of one or both of the titanium nitride and tungsten nitride.

The insulative material 20 may comprise any suitable composition(s); and in some embodiments may comprise, consist essentially of, or consist of silicon dioxide.

Dielectric-barrier material 26 extends along an outer periphery of the liner-material 24. The dielectric-barrier material 26 may comprise any suitable composition(s); and in some embodiments may comprise, consist essentially of, or consist of one or more high-k materials. The term "high-k" means a dielectric constant greater than that of silicon dioxide (i.e., greater than 3.9). Example high-k materials are aluminum oxide, hafnium oxide, zirconium oxide, etc.

The stack 12 is supported over a source structure 28. The source structure 28 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the source structure 28 may comprise conductively-doped silicon over tungsten silicide. The source structure 28 may be analogous to the structures 216 described above in the Background section of this disclosure.

The source structure is shown to be over an insulative material 30. The insulative material 30 may comprise any suitable composition(s); and in some embodiments may comprise one or more of silicon dioxide, silicon nitride, etc.

The insulative material 30 is supported by a base 32. The base 32 may comprise semiconductor material; and may, for example, comprise, consist essentially of, or consist of monocrystalline silicon. The base 32 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 32 may correspond to a semiconductor substrate containing one or more materials associated with integrated circuit fabrication. Such materials may include, for example, one or more of refractory metal materials, barrier materials, diffusion materials, insulator materials, etc.

The base 32 may have a planar surface 33 which extends along an illustrated horizontal y-axis.

Vertically-extending pillars 34 extend through the stack 12. Each of the pillars includes channel material 36, tunneling material 38, charge-storage material 40 and charge-blocking material 42.

In the illustrated embodiment, the pillars 34 extend along the z-axis direction of FIG. 5A, and the planar surface 33 of the base 32 extends along the x-axis direction of FIG. 5A. Accordingly, the pillars 34 extend orthogonally (or at least substantially orthogonally) relative to the planar upper surface 33 of the base 32; where the term "substantially orthogonally" means orthogonally to within reasonable tolerances of fabrication and measurement. However, it is to be understood that in other embodiments the vertically-extending pillars 34 may not extend orthogonally relative to the planar surface 33 of the base 32. In some embodiments, the vertically-extending pillars 34 may extend along a direction which is within about 10° of being orthogonal to the horizontal direction of the planar surface 33.

The channel material 36 comprises appropriately-doped semiconductor material. The semiconductor material may comprise any suitable composition(s); and in some embodiments may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15). In some embodiments, the channel material 36 comprises, consist essentially of, or consists of appropriately-doped silicon.

The tunneling material 38 (also referred to as insulative material or as charge-passage material) may comprise any suitable composition(s); and in some embodiments may comprise one or more of silicon dioxide, silicon nitride, silicon oxynitride, etc. The tunneling material may comprise a single composition, or may comprise a laminate of compositions, with such laminate being bandgap-engineered to achieve desired tunneling properties.

The charge-storage material 40 may comprise any suitable composition(s); and in some embodiments may comprise charge-trapping material; such as, for example, silicon nitride, conductive nanodots, etc. In some embodiments, the charge-storage material 40 may comprise silicon nitride having a stoichiometry of $Si_3N_4$. In some embodiments, the charge-storage material 40 may comprise silicon and nitrogen, and may or may not have the stoichiometry of $Si_3N_4$.

The charge-blocking material 42 may comprise any suitable composition(s); and in some embodiments may comprise silicon, oxygen and nitrogen (i.e., may comprise silicon oxynitride).

The channel material 36 within the pillars 34 is configured as vertically-extending cylinders 44. In some embodiments, such cylinders may be referred to as channel-material-cylinders, or as channel-material-pillars. In the illustrated embodiment, the channel-material-cylinders 44 are hollow, and a dielectric material 46 is provided within the hollows in the cylinders 44. The dielectric material 46 may comprise any suitable composition(s); and in some embodiments may comprise, consist essentially of, or consist of silicon dioxide.

The top-down view of FIG. 5 shows the channel material 36 configured as an annular ring surrounding the dielectric material 46.

In some embodiments, the channel-material-pillars 44 may be considered to have first lateral peripheries 45, and the pillars 34 may be considered to have second lateral peripheries 47 which are outward of the first lateral peripheries 45.

The tunneling material 38 may be considered to be adjacent to the channel material 36, and to be configured as cylinders 49 which laterally surround the channel-material-pillars 44. The charge-storage material 40 may be considered to be adjacent to the tunneling material 38, and to be configured as cylinders 51 which laterally surround the tunneling-material-cylinders 49. The charge-blocking material 42 may be considered to be adjacent to the charge-storage material 40 and to be configured as cylinders 53 which laterally surround the charge-storage-material-cylinders 51. In the illustrated embodiment, the tunneling-material-cylinders 49 are conformal to outer surfaces of the channel-material-cylinders 44, the charge-storage-material-cylinders 51 are conformal to outer surfaces of the tunneling-material-cylinders 49, and the charge-blocking-material-cylinders 53 are conformal to outer surfaces of the charge-storage-material-cylinders 51.

Vertically-stacked memory cells 50 are along the pillars 34. Each of the memory cells includes regions of the channel material 36, tunneling material 38, charge-storage material 40, charge-blocking material 42, dielectric-barrier material 26, and conductive structures 18.

The portions of the conductive structures 18 within the memory cells 50 may be considered to be gating regions 52. Other portions of the conductive structures 18 which are not within the memory cells 50 may be considered to be routing regions (wordline regions) 54.

The channel material 36 is shown to be electrically coupled with the source structure 28. A gap is illustrated between the source structure 28 and the stacked memory cells 50 to indicate that there may be other materials and devices between the source structure 28 and the memory cells. For instance, source-side select gates (SGSs) may be provided between the source structure 28 and the vertically-stacked memory cells 50.

The stacked memory cells 50 along a pillar 34 may correspond to a string of NAND memory devices. There may be any suitable number of memory cells within each string. For instance, in some embodiments the individual strings may comprise eight memory cells, 16 memory cells, 32 memory cells, 64 memory cells, 128 memory cells, etc.

The channel-material-pillars 44 may be electrically coupled to bitlines 56, which in turn may be electrically coupled with sensing circuitry (e.g., sense-amplifier-circuitry) 58. Only one of such connections is shown to simplify the drawing of FIG. 5A.

The routing regions (wordline regions) 54 may be electrically coupled with wordline-driver-circuitry 60. Only one of such connections is shown to simplify the drawing of FIG. 5A.

In the illustrated embodiment, the sense-amplifier-circuitry 58 and the wordline-driver-circuitry 60 are along the base 32, and beneath the memory cells 50 (i.e., beneath a memory array comprising the memory cells 50). The sense-amplifier-circuitry 58 and wordline-driver-circuitry 60 may be considered to be examples of logic circuitry (e.g., CMOS circuitry) which may be provided beneath an array of the memory cells 50. In some embodiments, at least some of the logic circuitry may be directly beneath the array of memory cells 50, and other portions of the logic circuitry may or may not be directly beneath the array of the memory cells (i.e., may be over the array of the memory cells, laterally offset relative to the array of the memory cells, etc.).

The base 32 is illustrated to be spaced from the insulative material 30 by a gap to indicate that there may be additional components and materials between the base 32 and the insulative material 30. Such additional components and materials may include, for example, regions of the illustrated logic circuits 58 and 60.

The top view of FIG. 5 shows the pillars 34 packed in a substantially hexagonal arrangement (where the term "substantially hexagonal arrangement" means a hexagonal arrangement to within reasonable tolerances of fabrication and measurement).

Insulative material 48 is shown to be laterally adjacent the arrangement of the pillars 34. The insulative material 48 may comprise any suitable composition(s); and in some embodiments may comprise, consist essentially of, or consist of silicon dioxide. The insulative material 48 may fill slits which are utilized during a gate replacement process to form the materials 26, 22 and 24 along the levels 14. The filled slits may correspond to panels which separate adjacent blocks of memory cells from one another.

In some embodiments, the pillars 34 may be considered to extend primarily along a first direction (the z-axis direction of FIG. 5A), and the top-down view of FIG. 5 may be considered to be a cross-sectional view along a second direction (the y-axis direction of FIG. 5A) which is orthogonal to the first direction. The pillars 34 have lateral peripheries 47 which are configured as three-sided shapes 60. Each of such shapes comprises three sides 61, 63 and 65, and comprises corners (vertices) 62, 64 and 66 where the sides join to one another. The vertices 62, 64 and 66 are rounded. The sides 61, 63 and 65 are all about the same length as one another, and extend at about 60° angles relative to one another. In some embodiments, the three-sided shapes 60 may be considered to correspond to (or at least substantially to) equilateral triangles with rounded vertices.

The channel-material-cylinders (channel-material pillars) 44 have three-sided shapes conformal to the three-sided shapes of the pillars 60.

Figure 6:
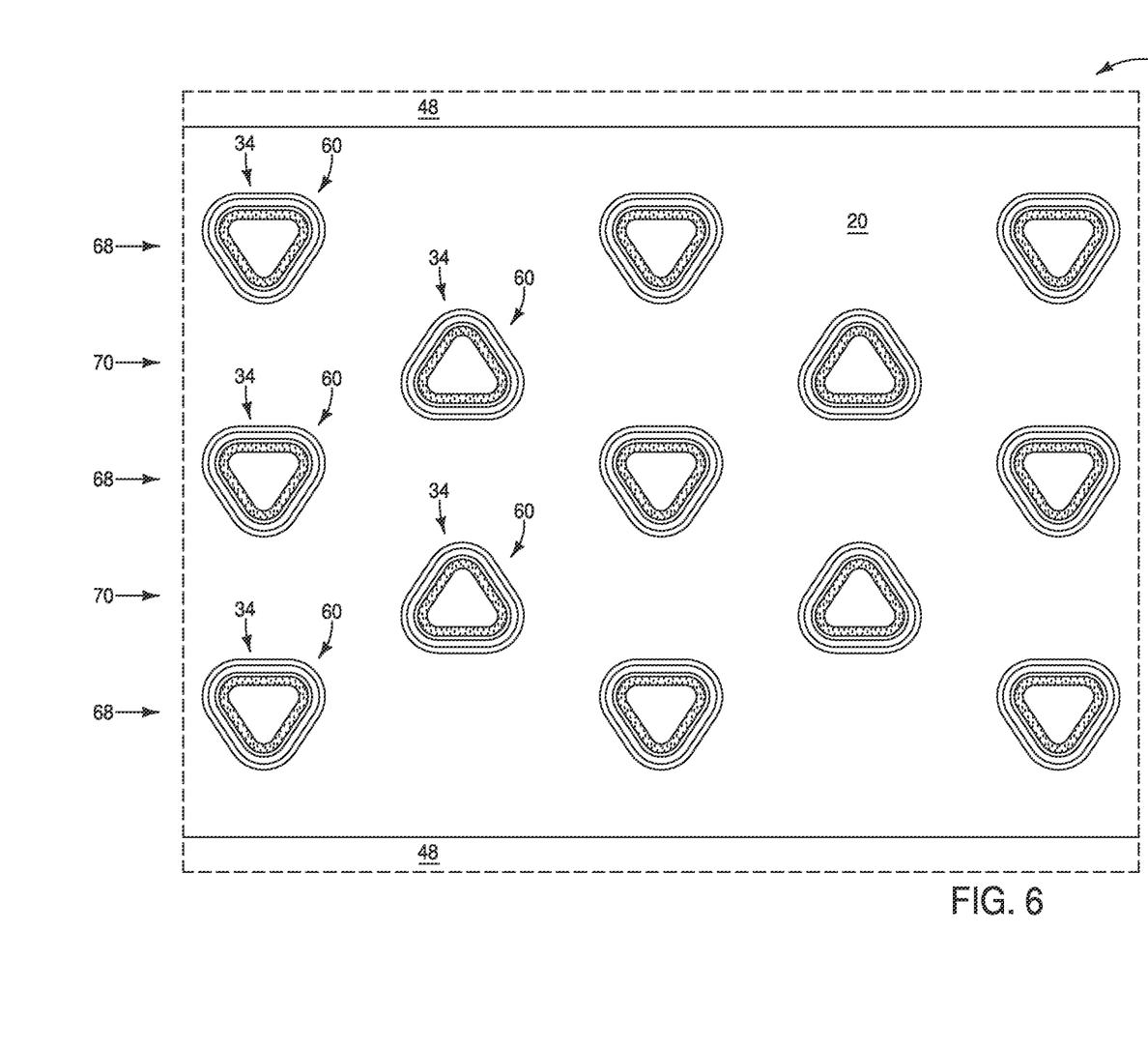
FIG. 6 is a diagrammatic cross-sectional top-down view of a region of another example integrated assembly.

FIG. 5 shows the pillars 34 in an arrangement in which all of the pillars have substantially the same alignment as one another. FIG. 6 shows another example hexagonal arrangement of the pillars 34, but shows the pillars arranged in alternating rows 68 and 70, with the three sided shapes 60 of the pillars in the first rows 68 being inverted relative to the three-sided shapes of the pillars 34 in the second rows 70. Such may enable improved packing of the pillars 34.

An advantage of the pillars 34 having the three-sided-shaped cross-sections is that such may improve charge retention as compared to conventional pillars having circular-shaped cross-sections, while maintaining rapid program/erase speeds. Specifically, the rounded vertices 62, 64 and 66 may provide pockets for retaining charge. Such mechanism is provided to assist the reader an understanding the invention. The suggested mechanism is not to limit this disclosure or the claims that follow in any manner, except to the extent, if any, that such mechanism is expressly recited in the claims.

In some embodiments, the three-sided shapes 60 may be based on an original circular shape of a conventional pillar, and may be formed so that they may be packed to about the same density as the conventional pillar. Accordingly, the advantages of the three-sided shapes may be achieved without adversely influencing packing density. In some embodiments, the three-sided shapes 60 may be based on an original circular shape of a conventional pillar, and may be formed to be packed to a tighter density than the conventional pillar, to the same density as the conventional pillar, or to a looser density than the conventional pillar.

An example method for generating a suitable three-sided shape 60 is described with reference to FIGS. 7-13.

Figures 7, 10:
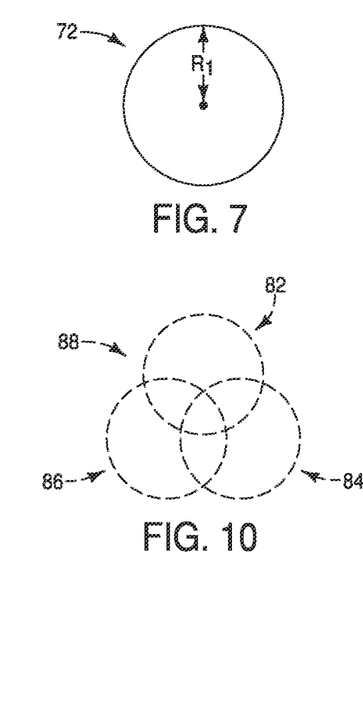
FIGS. 7-12 are diagrammatic views of example steps that may be utilized to generate an example three-sided configuration from an example circular starting shape.

Referring to FIG. 7, a circular shape 72 is provided. The circular shape 72 may be a cross-sectional shape of a conventional pillar. The circular shape 72 has a radius $R_1$.

Figure 8:
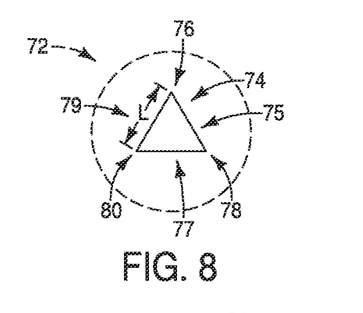

Referring to FIG. 8, an equilateral triangle template 74 is centered relative to the circular shape 72. The triangle template 74 may be of any suitable size, and may be entirely contained within the circular shape 72 (as shown) or not. The triangle template 74 has three sides 75, 77 and 79; and three vertices (corners) 76, 78 and 80. The sides of the triangle template 74 have lengths L.

Figure 9:
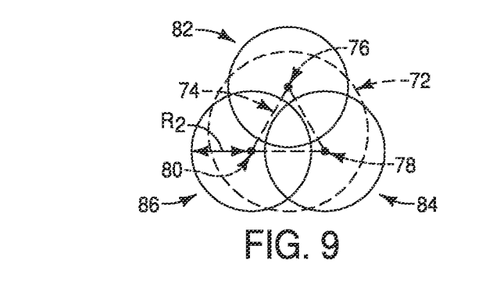

Referring to FIG. 9, a first circle template 82 is centered over the first vertex (corner) 76 of the triangle template 74, a second circle template 84 is centered over the second vertex (corner) 78 of the triangle template 74, and a third circle template 86 is centered over the third vertex (corner) 80 of the triangle template 74. The circle templates 82, 84 and 86 have radii $R_2$.

FIG. 10 shows the circles 82, 84 and 86 in isolation from the triangle template 74 and the original circle shape 72. The overlapping three circles 82, 84 and 86 form a configuration 88.

Figure 11:
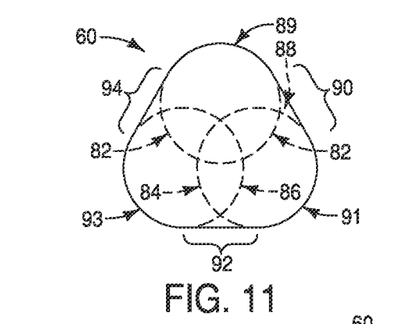

Referring to FIG. 11, the three-sided shape 60 is formed utilizing outer edges 89, 91 and 93 of the three circles 82, 84 and 86, respectively; with such outer edges being outward of the vertices 76, 78 and 80 (FIG. 9) of the equilateral triangle template 74 (FIG. 9). The three sided shapes 60 also includes segments (connections) 90, 92 and 94 that extend between the rounded edges 89, 91 and 93. In some embodiments, each of the segments 90, 92 and 94 may be considered to be tangent to the circle templates to which the segment joins (e.g., the segment 90 may be considered to be tangent to the circle templates 82 and 84).

Figure 12:
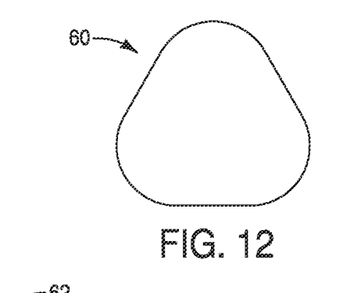

FIG. 12 shows the resulting three-sided shape 60 in isolation from the circle templates 82, 84 and 86.

Figure 13:
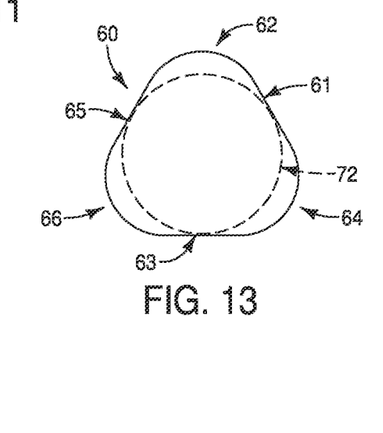
FIG. 13 is a diagrammatic view of the example three-sided configuration of FIG. 12 superimposed over the example circular starting shape of FIG. 7.

FIG. 13 shows the three-sided shape 60 superimposed on the original starting circle 72. In the illustrated embodiment, the three-sided shape 60 has the rounded vertices 62, 64 and 66 which project outwardly beyond the shape of the starting circle 72, and has the sides 61, 63 and 65 which overlap an edge of the starting circle 72. Accordingly, the three-sided shape 60 can be packed to a similar density as the starting circle 72.

The shape 60 may be tailored relative to an original starting circle 72 by tailoring the size of the equilateral triangle template 74 and/or by tailoring the sizes of the circle templates 82, 84 and 86. Such is illustrated utilizing FIGS. 14-16.

Figure 14:
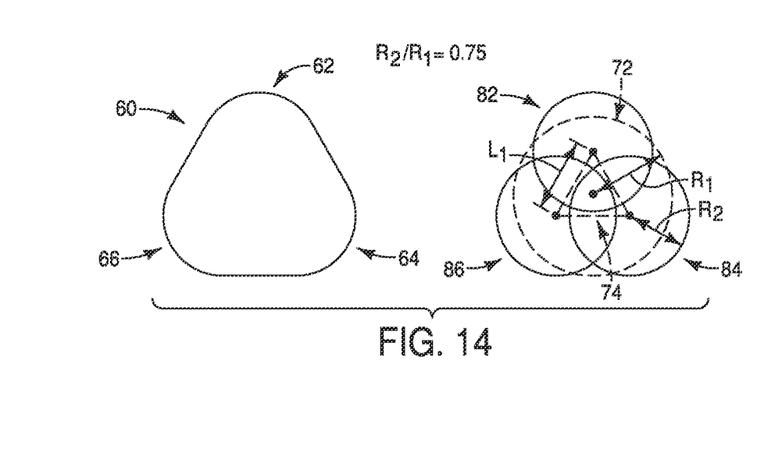
FIGS. 14-16 are diagrammatic views of example three-sided configurations (the configurations shown at the left-sides of the figures), and example arrangements that may be utilized to generate the configurations (the arrangements shown at the right-sides of the figures).

The right-side of FIG. 14 shows the three-sided shape 60 of FIG. 12, and the left-side of FIG. 14 shows the arrangement of the equilateral triangle template 74 and the circle templates 82, 84 and 86 relative to the starting circle 72. The illustrated embodiment has a ratio $R_1/R_2$ of 0.75, and has the triangle template 74 with sidewalls of length $L_1$.

Figure 15:
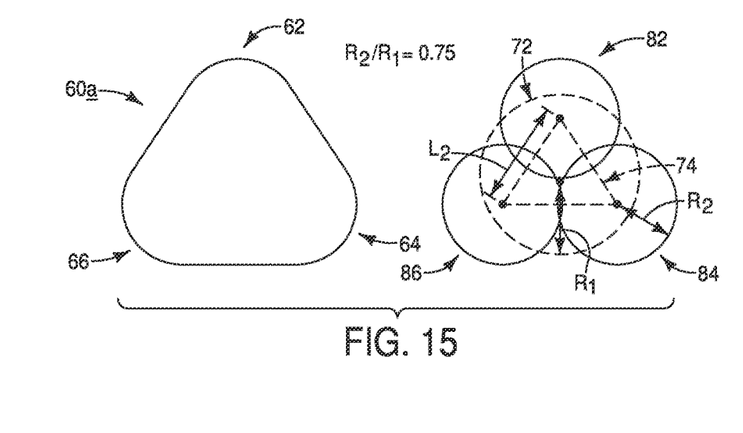

The right-side of FIG. 15 shows a three-sided shape 60a resulting from an arrangement shown on the left-side of FIG. 15. The arrangement of FIG. 15 has the circle templates 82, 84 and 86 with the same dimensions as those of FIG. 14 (i.e., $R_1/R_2$=0.75), but has the triangle template 74 with sides of length $L_2$ which is greater than the length $L_1$ of the sides of the triangle template of FIG. 14. Accordingly, the three-sided structure 60a of FIG. 15 is larger than the three-sided structure 60 of FIG. 14.

Figure 16:
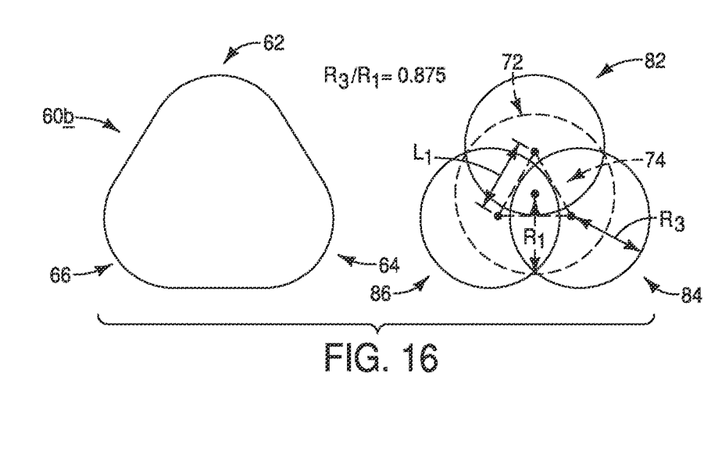

The right-side of FIG. 16 shows a three-sided shape 60b resulting from an arrangement shown on the left-side of FIG. 16. The arrangement of FIG. 16 has a triangle template 74 identical to that utilized in the arrangement of FIG. 14, but utilizes circle templates 82, 84 and 86 having radii $R_3$ which is larger than the radii $R_2$ of the circle templates utilized in FIG. 14 (specifically, $R_3/R_1$=0.875). Accordingly, the three-sided structure 60b of FIG. 16 is about the same size as that of FIG. 14, but has more rounding of the vertices 62, 64 and 66.

The memory cells 50 described herein (FIG. 5A) may be operated as part of NAND memory devices. In operation, the charge-storage material (40) may be configured to store information in the memory cells 50. The value (with the term "value" representing one bit or multiple bits) of information stored in an individual memory cell 50 may be based on the amount of charge (e.g., the number of electrons) stored in a charge-storage region of the memory cell. The amount of charge within an individual charge-storage region may be controlled (e.g., increased or decreased) at least in part, based on the value of voltage applied to an associated control gate, and/or based on the value of voltage applied to an associated channel material 36.

The tunneling material 38 may be configured to allow desired tunneling (e.g., transportation) of charge (e.g., electrons) between the charge-storage material 40 and the channel material 36. The tunneling material may be configured (i.e., engineered) to achieve a selected criterion, such as, for example, but not limited to, an equivalent oxide thickness (EOT). The EOT quantifies the electrical properties of the tunneling material, (e.g., capacitance) in terms of a representative physical thickness. For example, EOT may be defined as the thickness of a theoretical silicon dioxide layer that would be required to have the same capacitance density as a given dielectric (e.g., tunneling material 38), ignoring leakage current and reliability considerations.

The charge-blocking material 42 may provide a mechanism to block charge from flowing from the charge-storage material to the control gates.

The dielectric barrier material 26 may be utilized to inhibit back-tunneling of electrons from the control gates toward the charge-storage material.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multi-chip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include a pillar which contains semiconductor material, and which extends primarily along a first direction. A cross-section through the pillar along a second direction orthogonal to the first direction is through the semiconductor material and includes a lateral periphery of the pillar configured as three-sided shape.

Some embodiments include an integrated assembly having vertically-stacked memory cells along a vertically-extending pillar. The pillar includes a cylinder of channel material. Each of the memory cells along the pillar includes a region of said cylinder. The cylinder has a top-down cross-section having a lateral periphery configured as a three-sided shape.

Some embodiments include an integrated assembly having a vertical stack of alternating first and second levels. The first levels include conductive structures and the second levels are insulative. Channel-material-pillars extend through the vertical stack. Each of the channel-material-pillars has a top-down cross-section which includes a lateral periphery configured as three-sided shape corresponding substantially to an equilateral triangle with rounded vertices.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A pillar comprising semiconductor material and extending primarily along a first direction; a cross-section through the pillar along a second direction orthogonal to the first direction being through the semiconductor material and comprising a lateral periphery of the pillar configured as a three-sided shape;
   a central-most material comprising rounded corners in the three-sided shape; and
   a charge-storage material surrounding the central-most material and comprising conductive nanodots.

2. The pillar of claim 1 wherein the pillar comprises a plurality of pillars configured as three-sided shapes, all the three-sided shapes of the plurality of pillars pointing in the same direction.

3. The pillar of claim 1 wherein the central-most material comprises a dielectric material.

4. The pillar of claim 1 extending vertically, and wherein the configuration is along a horizontal cross-section through the vertically-extending pillar.

5. The pillar of claim 1 wherein the semiconductor material is a channel material, and the pillar further comprising:
   a tunneling material between the channel material and the charge-storage material.

6. The pillar of claim 1 wherein the central-most material comprises silicon dioxide.

7. The pillar of claim 1 wherein the pillar comprises a hollow structure.

8. The pillar of claim 1 further comprising a gate structure proximate the pillar, the gate structure comprising a conductive core and a conductive liner surrounding the conductive core.

9. The pillar of claim 8 further comprising a dielectric-barrier layer surrounding the conductive core.

10. An integrated assembly, comprising:
    vertically-stacked memory cells along a vertically-extending pillar; the memory cells comprising gate structures having conductive cores with conductive liners surrounding the conductive cores; the pillar comprising a cylinder of channel material, each of the memory cells including a region of said cylinder;
    the cylinder having a top-down cross-section comprising a lateral periphery configured as a three-sided shape; and
    a central-most material within the three-side shape, the central-most material comprising rounded corners.

11. The integrated assembly of claim 10 wherein the three-sided shape has rounded corners where the sides of the three-sided shape join to one another.

12. The integrated assembly of claim 10 wherein the three-sided shape corresponds substantially to an equilateral triangle with rounded vertices.

13. The integrated assembly of claim 10 wherein the central-most material comprises silicon dioxide.

14. The integrated assembly of claim 10 wherein the vertically-extending pillar comprises a hollow structure.

15. The integrated assembly of claim 10 further comprising dielectric-barrier layers surrounding the conductive cores.

16. The integrated assembly of claim 10 wherein the channel material comprises nihonium.

17. An integrated assembly of memory cells, comprising:
    a plurality of vertically-extending pillars comprising a cylinder of channel material, the cylinders being hollow and having a top-down cross-section comprising a lateral periphery configured as a three-sided shape; and
    wherein all the three-sided shapes of the plurality of the vertically-extending pillars pointing in the same direction.

18. The integrated assembly of claim 17 wherein a central-most material within the three-side shape, the central-most material comprising rounded corners.

19. The integrated assembly of claim 17 further comprising gate structures proximate the plurality of the vertically-extending pillars, the gate structures comprising conductive cores and conductive liners surrounding the conductive cores.

20. The integrated assembly of claim 19 further comprising dielectric-barrier layers surrounding the conductive cores.

21. A pillar comprising:
    a cylinder of channel material, the cylinders having a top-down cross-section comprising a lateral periphery configured as a three-sided shape;
    wherein the channel material comprises an outer periphery opposite an inner periphery, the inner periphery comprising rounded corners; and
    wherein the outer periphery comprises pointed corners.

22. The pillar of claim 21 wherein the cylinder of channel material comprises a plurality of cylinders of channel material configured as three-sided shapes, all the three-sided shapes of the plurality of cylinders pointing in the same direction.

23. The pillar of claim 21 wherein the channel material comprises nihonium.

24. The pillar of claim 21 wherein the cylinder of the channel material comprises a hollow structure.

25. A pillar comprising:
a cylinder of channel material, the cylinders having a top-down cross-section comprising a lateral periphery configured as a three-sided shape;
wherein the channel material comprises an outer periphery opposite an inner periphery, the inner periphery comprising rounded corners; and
wherein the cylinder of channel material comprises a plurality of cylinders of channel material configured as three-sided shapes, all the three-sided shapes of the plurality of cylinders pointing in the same direction.

* * * * *